(12) United States Patent
Chen et al.

(10) Patent No.: US 9,326,419 B2
(45) Date of Patent: Apr. 26, 2016

(54) HEAT DISSIPATION SYSTEM FOR COMMUNICATION DEVICE WITH BOX TYPE CHASSIS, BOX TYPE CHASSIS, AND COMMUNICATION DEVICE

(71) Applicant: Huawei Technologies Co., Ltd., Shenzhen, Guangdong (CN)

(72) Inventors: Gang Chen, Shenzhen (CN); Shoukai Zhang, Shenzhen (CN); Liwen Shu, Beijing (CN); Weidong Tang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 220 days.

(21) Appl. No.: 14/102,099

(22) Filed: Dec. 10, 2013

(65) Prior Publication Data

US 2014/0098493 A1    Apr. 10, 2014

Related U.S. Application Data

(63) Continuation of application No. PCT/CN2012/083535, filed on Oct. 26, 2012.

(30) Foreign Application Priority Data

Oct. 27, 2011    (CN) .......................... 2011 1 0331930

(51) Int. Cl.
    *H05K 7/20*    (2006.01)
(52) U.S. Cl.
    CPC ........ *H05K 7/20127* (2013.01); *H05K 7/20145* (2013.01); *H05K 7/20563* (2013.01)
(58) Field of Classification Search
    None
    See application file for complete search history.

(56) References Cited

U.S. PATENT DOCUMENTS

| | | | | |
|---|---|---|---|---|
| 5,949,646 A | * | 9/1999 | Lee ...................... | H05K 7/2019 165/104.33 |
| 6,587,340 B2 | * | 7/2003 | Grouell ................ | H05K 7/2019 165/122 |
| 6,594,148 B1 | * | 7/2003 | Nguyen ............. | H05K 7/20563 361/695 |
| 6,704,196 B1 | * | 3/2004 | Rodriguez ......... | H05K 7/20736 165/104.33 |
| 7,016,193 B1 | * | 3/2006 | Jacques .............. | H05K 7/20563 165/104.33 |
| 7,573,713 B2 | * | 8/2009 | Hoffman ............ | H05K 7/20136 165/80.3 |
| 7,817,419 B2 | * | 10/2010 | Illerhaus ................... | H02J 7/35 165/104.33 |
| 7,843,685 B2 | * | 11/2010 | Beauchamp ............ | G06F 1/185 312/223.2 |
| 8,159,820 B2 | * | 4/2012 | Ibori ..................... | H02M 7/003 174/252 |

(Continued)

FOREIGN PATENT DOCUMENTS

| | | |
|---|---|---|
| CN | 1852648 A | 10/2006 |
| CN | 101586861 A | 11/2009 |

(Continued)

*Primary Examiner* — Courtney Smith

(57) ABSTRACT

A heat dissipation system in a box type chassis of a communication device includes an upper heat dissipation channel and a lower heat dissipation channel, which both have an air exhaust vent and an air intake vent, the air intake vent and the air exhaust vent of the upper heat dissipation channel and the lower heat dissipation channel are defined on sidewalls of the box type chassis, and the air intake vent of the upper heat dissipation channel is located above the air exhaust vent of the lower heat dissipation channel. An air baffle is arranged in the box type chassis to generate a circulative airflow in the box type chassis, and therefore, heat dissipated by a circuit board is circulated in the box type chassis through the airflow, the temperature in the box type chassis reaches an extent that prevents vapor from condensing or even becoming a water film.

8 Claims, 3 Drawing Sheets

(56) References Cited

U.S. PATENT DOCUMENTS

| | | | |
|---|---|---|---|
| 2005/0241810 A1* | 11/2005 | Malone | H05K 7/20727 165/122 |
| 2006/0109624 A1 | 5/2006 | Hung | |
| 2007/0133167 A1* | 6/2007 | Wagner | H05K 7/20727 361/679.4 |
| 2007/0201205 A1* | 8/2007 | Holmes | G06F 1/20 361/695 |
| 2008/0031735 A1* | 2/2008 | Chen | F03D 1/025 416/128 |
| 2011/0122572 A1 | 5/2011 | Cheng et al. | |

FOREIGN PATENT DOCUMENTS

| | | |
|---|---|---|
| CN | 101634477 A | 1/2010 |
| CN | 102510704 A | 6/2012 |
| JP | 2011191974 A | 9/2011 |

* cited by examiner

HEAT DISSIPATION SYSTEM FOR COMMUNICATION DEVICE WITH BOX TYPE CHASSIS, BOX TYPE CHASSIS, AND COMMUNICATION DEVICE

CROSS-REFERENCE TO RELATED APPLICATIONS

This application is a continuation of International Application No. PCT/CN2012/083535, filed on Oct. 26, 2012, which claims priority to Chinese Patent Application No. 201110331930.1, filed on Oct. 27, 2011, both of which are hereby incorporated by reference in their entireties.

TECHNICAL FIELD

The present application relates to heat dissipation technologies for a communication device, and in particular, to a heat dissipation system for a communication device with a box type chassis, a box type chassis, and a communication device with a box type chassis.

BACKGROUND

The installation environment of a communication device needs to meet strict temperature and humidity requirements. However, with the development of communication technologies, the communication device may be installed in a humid environment with heavy dust and salt fog. In addition, with the upgrade of capacity of the communication device, both frame type products and box type products have higher and higher power consumption, and need fans for heat dissipation and air cooling. However, being air-cooled in an adverse environment, circuit boards of the communication device are more vulnerable to corrosion, which affects communication quality or even interrupts communication services and increases maintenance costs of an operator.

Communication device corrosion mainly results from electrochemical corrosion, and "relative humidity+dust" is a main cause for electrochemical corrosion of a circuit board. Generally, vapor can penetrate a solder mask of the circuit board, or even penetrate an organic coating material and enter a metal material surface. Scientific research shows that the critical value of relative humidity of the air that corrodes metal is: 70% RH for steel, 60% RH for copper, 76% RH for aluminum, 63% RH for iron, and 60% RH for zinc. If metal is placed in an environment where the critical value is exceeded, vapor may condense into a water film on the metal surface to corrode the metal. With the increase of the relative humidity, the corrosion proceeds faster and faster. A formula for calculating the relative humidity is: $\Phi = Z/Zb \times 100\%$, where $\Phi$ is relative humidity, $Z$ is an absolute moisture content, and $Zb$ is a saturated moisture content. As long as a condensed water film exists in the environmental medium on the surface of the metal material, even if the amount of condensed water is small, an electrochemical corrosion process occurs on the circuit board.

Currently, the relative humidity and dust pollution on the surface of the circuit board inside the communication device may be reduced by two methods, where one method is to apply a conformal coating to the circuit board, and the other method is box type air cooling, so as to enhance environment adaptability of the outdoor installed communication device.

In the former method, the conformal coating is a chemical protective material that resists salt fog, moisture, and dust. The protective film formed by the conformal coating can isolate the circuit board and protect the circuit board against corrosion caused by chemicals, moisture, and other contaminants, improve and extend the service life of the circuit board, and ensure safety and reliability. In practice, the conformal coating is applied to the exterior of the circuit board to be protected, forming a film that is 25 microns to 50 microns thick. The film can protect the circuit board against damage in the case of chemical moisture, salt spray, humidity, high temperature, and the like.

However, an effective protection period of the conformal coating is only 3 to 5 years, which cannot meet the requirement of the communication device product that has a 10-year service life. In addition, the spraying process of the conformal coating is complicated. Tooling is needed to protect connectors on the circuit board and prevent the conformal coating from polluting pins and causing circuit faults; and after completion of spraying, burning-off is required, which increases manufacturing steps. In addition, the protection method is costly. The material of the conformal coating is expensive, and the spraying process also increases the manufacturing cost.

The latter method includes two heat dissipation ways: box type full air blowing or box type full air extraction. The box type full air extraction is shown in FIG. 1. A fan is installed at the air exhaust vent, and air is extracted in the frame body of the communication device, which reduces dust intake in a certain time period and is good for corrosion prevention to some extent.

However, the cooling effect of the box type full air extraction system tends to condense vapor into a water film, which causes circuit board corrosion.

SUMMARY

Embodiments of the present application disclose a heat dissipation system for a communication device with a box type chassis, a box type chassis, and a communication device with a box type chassis to prevent generation of a water film in a chassis of a communication device with a box type chassis.

An embodiment of the present application provides a heat dissipation system for a communication device with a box type chassis, including an upper heat dissipation channel and a lower heat dissipation channel, where the upper heat dissipation channel and the lower heat dissipation channel both have an air exhaust vent and an air intake vent, the air intake vent and the air exhaust vent of the upper heat dissipation channel and the lower heat dissipation channel are defined on sidewalls of the box type chassis, and the air intake vent of the upper heat dissipation channel is located above the air exhaust vent of the lower heat dissipation channel.

An embodiment of the present application further provides a box type chassis, in which the heat dissipation system for a communication device with a box type chassis is arranged.

An embodiment of the present application further provides a communication device with a box type chassis, including electronic components and further including the box type chassis, where the electronic components are located in an upper heat dissipation channel and a lower heat dissipation channel of a heat dissipation system in the box type chassis.

As regards the heat dissipation system for a communication device with a box type chassis, the box type chassis, and the communication device with a box type chassis in the embodiments of the present application, an upper heat dissipation channel and a lower heat dissipation channel are arranged in the box type chassis, and therefore, heat dissipated by a circuit board is circulated in the box type chassis through an airflow, the temperature in the box type chassis reaches an extent that prevents vapor from condensing or even becoming a water film, no condensation or water film is generated, and the circuit board is protected against corrosion caused by condensation.

BRIEF DESCRIPTION OF DRAWINGS

To illustrate the technical solutions in the embodiments of the present application more clearly, the following briefly introduces the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

Figure 1:
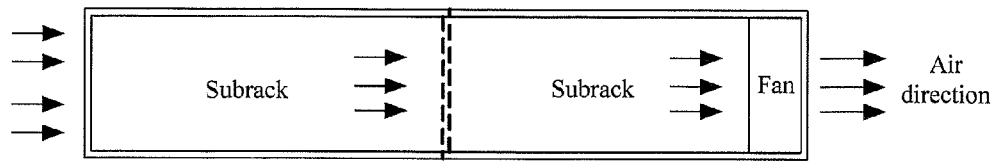
FIG. 1 is a schematic diagram of full air extraction of a communication device with a box type chassis.

The following clearly describes the technical solutions in the embodiments of the present application with reference to the accompanying drawings in the embodiments of the present application. Apparently, the described embodiments are merely a part rather than all of the embodiments of the present application. All other embodiments obtained by a person of ordinary skill in the art based on the embodiments of the present application without creative efforts shall fall within the protection scope of the present application.

A heat dissipation system for a communication device with a box type chassis, which is provided in an embodiment of the present application, includes an upper heat dissipation channel and a lower heat dissipation channel, where the upper heat dissipation channel and the lower heat dissipation channel both have an air exhaust vent and an air intake vent, the air intake vent and the air exhaust vent of the upper heat dissipation channel and the lower heat dissipation channel are defined on sidewalls of the box type chassis, and the air intake vent of the upper heat dissipation channel is located above the air exhaust vent of the lower heat dissipation channel. For example, an air baffle parallel to the airflow generated by a fan is arranged in the box type chassis, and the air baffle splits the interior of the box type chassis into an upper heat dissipation channel and a lower heat dissipation channel.

As regards the heat dissipation system for a communication device with a box type chassis in the embodiment, the air intake vent of the upper heat dissipation channel is arranged above the air exhaust vent of the lower heat dissipation channel. Therefore, the cooling air direction of the upper heat dissipation channel is opposite to that of the lower heat dissipation channel, temperature at the air exhaust vent rises to an extent that prevents vapor from condensing, condensation is prevented, and the circuit board in the chassis is protected against corrosion.

Further, the air exhaust vent of the upper heat dissipation channel is located above the air intake vent of the lower heat dissipation channel.

Further, a first channel is arranged in the heat dissipation system, and the first channel connects a position on the upper heat dissipation channel and near the air exhaust vent to a position on the lower heat dissipation channel and near the air intake vent, and is used to guide some hot air of the upper heat dissipation channel into the lower heat dissipation channel. For example, the first channel may be implemented by arranging through-holes on the air baffle.

Further, a second channel is arranged in the heat dissipation system, and the second channel connects a position on the lower heat dissipation channel and near the air exhaust vent to a position on the upper heat dissipation channel and near the air intake vent, and is used to guide some hot air of the lower heat dissipation channel into the upper heat dissipation channel. For example, the second channel may be implemented by arranging through-holes on the air baffle.

Further, a fan is arranged at the air intake vent of the upper heat dissipation channel and is used to guide outside air and hot air out of the air exhaust vent of the lower heat dissipation channel into the upper heat dissipation channel.

Further, a fan is arranged at the air exhaust vent of the upper heat dissipation channel and is used to guide the upper heat dissipation channel to the outside.

Further, a fan is arranged at the air intake vent of the lower heat dissipation channel and is used to guide outside air and hot air out of the air exhaust vent of the upper heat dissipation channel into the lower heat dissipation channel.

Further, a fan is arranged at the air exhaust vent of the lower heat dissipation channel and is used to guide hot air out of the air exhaust vent of the lower heat dissipation channel to the outside.

Further, through-holes may be opened on the air baffle at the end of the channel to adjust a backflow volume of an airflow between the two channels.

Figure 2:
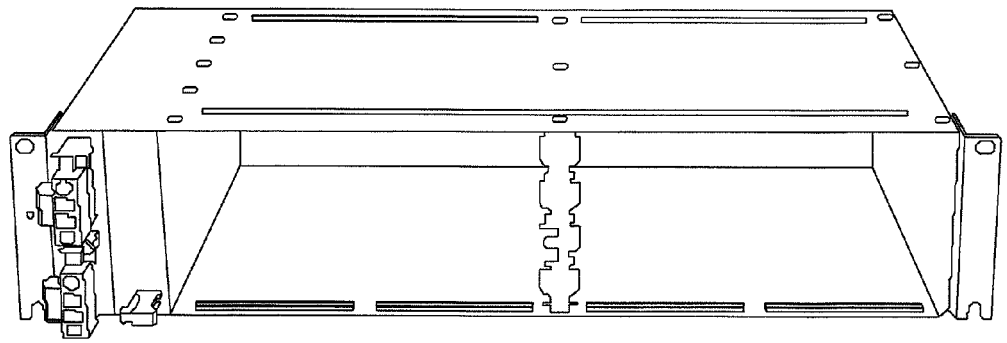
FIG. 2 is a schematic diagram of a box type chassis of a communication device with the box type chassis.

The following uses five embodiments to describe a heat dissipation system in further detail with reference to a box type chassis of a network device shown in FIG. 2.

Embodiment 1

Figure 3:
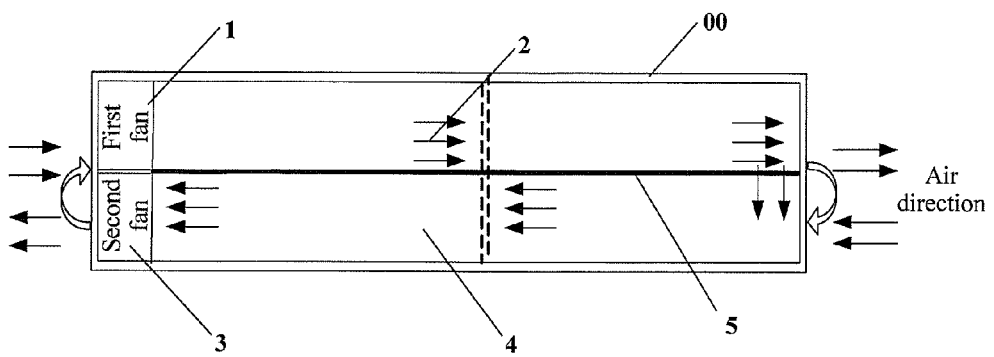
FIG. 3 is a schematic diagram of a heat dissipation system according to Embodiment 1 of the present application.

As shown in FIG. 3, a heat dissipation system for a communication device with a box type chassis includes a chassis 00, a first fan 1, a second fan 3, and an adjustable air baffle 5, where an arrow indicates an airflow direction.

Ventilation holes exist on the left sidewall and the right sidewall of the chassis 00. The adjustable air baffle 5 is parallel to the airflow generated by the first fan 1 and the second fan 3, and is parallel to a circuit board slot on the chassis 00 to split the chassis 00 into an upper layer and a lower layer and form two heat dissipation channels: an upper heat dissipation channel 2 and a lower heat dissipation channel 4, so as to prevent the cooling air generated by the fans from completely circulating in the chassis 00. Through-holes exist on the adjustable air baffle 5 to connect the upper heat dissipation channel 2 to the lower heat dissipation channel 4, and adjust the circulative volume of the cooling air, that is, the backflow volume of the cooling air, in the chassis 00.

The first fan 1 is a fan that blows air into the chassis 00, and is located at the left end of the upper heat dissipation channel 2.

The second fan 3 is a fan that blows air out of the chassis 00, and is located at the left end of the lower heat dissipation channel 4.

As seen from FIG. 3, the air in the upper heat dissipation channel 2 flows to the right side, and the air in the lower heat dissipation channel 4 flows to the left side. The two channels have opposite air flow directions so that the airflow circulates inside the chassis 00.

After the communication device is started and becomes stable, due to heat dissipation of a circuit board, the cool air blown by the first fan 1 into the chassis 00 is heated by the circuit board and becomes hot air, and its temperature reaches the peak at the air exhaust vent. The second fan 2 blows air to the outside, and generates a negative pressure at the air intake vent at the left upper layer of the chassis 00, that is, at the left end of the upper heat dissipation channel 2, so as to take in air. The lower layer air intake vent, that is, the right end of the lower heat dissipation channel 4, is immediately close to the upper layer air exhaust vent, that is, the right end of the upper heat dissipation channel 2, so that some hot air from the upper layer air exhaust vent is taken into the lower heat dissipation channel 4 and some hot air is circulated in the chassis 00. Similarly, the first fan 1 also takes in some hot air from the lower layer air exhaust vent, that is, the left end of the lower heat dissipation channel 4, and therefore, the temperature at the upper layer air intake vent and the temperature at the lower layer air intake vent rise simultaneously.

Four temperature sensing K wires are extended into the chassis to approach the inner side of the ventilation holes to measure the temperature at the upper layer intake/exhaust vent and the lower layer air intake/exhaust vent respectively for many times, and the measurement is performed for several scenarios such as full-capacity configuration (that is, each slot of a subrack is occupied by a circuit board) or non-full-capacity configuration, low temperature (20° C.), and high temperature (40° C.), and it is proven that the temperature rise at both the upper layer air intake vent and the lower layer air intake vent may reach up to 7.5° C., which prevents condensation on the circuit board effectively.

Embodiment 2

Figure 4:
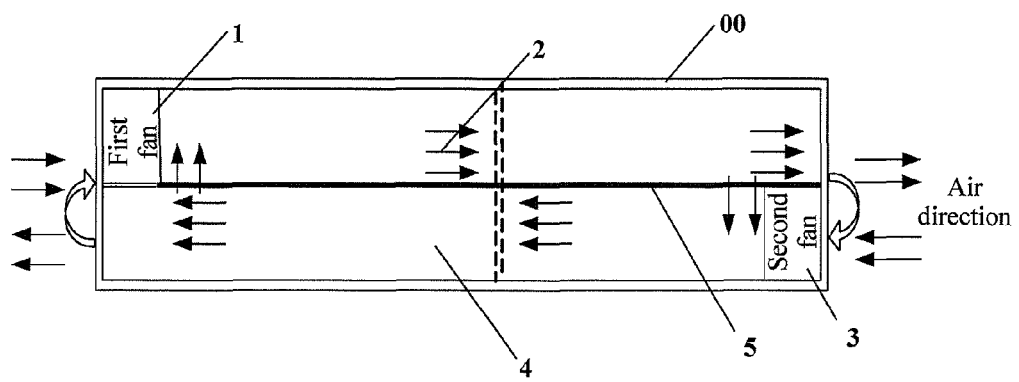
FIG. 4 is a schematic diagram of a heat dissipation system according to Embodiment 2 of the present application.

This embodiment is similar to Embodiment 1, but differs in the location of the second fan 3 in the lower heat dissipation channel 4. As shown in FIG. 4, the second fan 3 is located at the right end of the lower heat dissipation channel 4, and becomes a fan that blows air into the chassis 00.

In this embodiment, a fan is arranged at the right end of the lower heat dissipation channel to facilitate heat dissipation.

Embodiment 3

Figure 5:
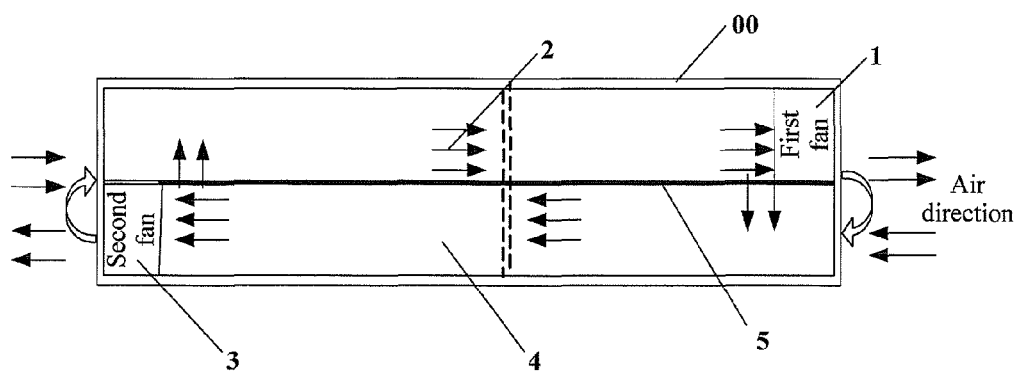
FIG. 5 is a schematic diagram of a heat dissipation system according to Embodiment 3 of the present application.

This embodiment is similar to Embodiment 1, but differs in the location of the first fan 1 in the upper heat dissipation channel 2. As shown in FIG. 5, the first fan 1 is located at the right end of the upper heat dissipation channel 2, and becomes a fan that blows air out of the chassis 00.

In this embodiment, a fan is arranged at the right end of the upper heat dissipation channel to facilitate heat dissipation.

Embodiment 4

Figure 6:
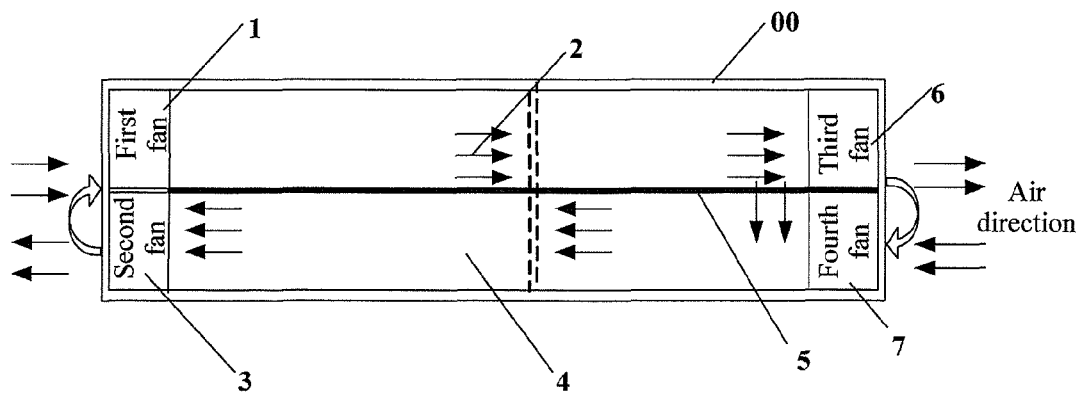
FIG. 6 is a schematic diagram of a heat dissipation system according to Embodiment 4 of the present application.

This embodiment is similar to Embodiment 1, but differs in that more fans are added. As shown in FIG. 6, on the basis of Embodiment 1, a third fan 6 is added at the right end of the upper heat dissipation channel 2, and a fourth fan 7 is added at the right end of the lower heat dissipation channel 4. The third fan 6 blows air outward, and the fourth fan 7 blows air inward.

In this embodiment, fans are arranged at the left and right ends of the upper and lower heat dissipation channels to further facilitate heat dissipation.

Embodiment 5

Figure 7:
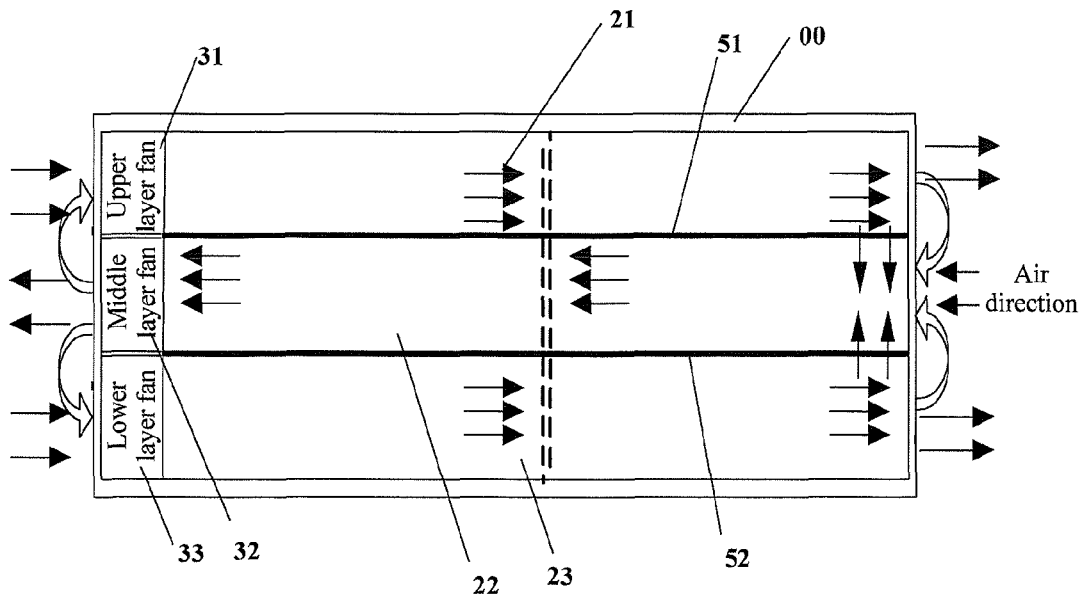
FIG. 7 is a schematic diagram of a heat dissipation system according to Embodiment 5 of the present application.

This embodiment is similar to Embodiment 1, but differs in that more air baffles and corresponding fans are added. As shown in FIG. 7, the heat dissipation system includes two air baffles and three fans. Specifically, a first air baffle 51 and a second air baffle 52 in the chassis 00 split the interior of the chassis 00 into an upper heat dissipation channel 21, a middle heat dissipation channel 22, and a lower heat dissipation channel 23. An upper layer fan 31 is arranged at the left end of the upper heat dissipation channel 21, and the upper layer fan 31 blows air into the chassis 00; a middle layer fan 32 is arranged at the left end of the middle heat dissipation channel 22, and the middle layer fan 32 blows air out of the chassis 00; and a lower layer fan 33 is arranged at the left end of the lower heat dissipation channel 23, and the lower layer fan 33 blows air into the chassis 00. In this way, the airflow direction of the upper heat dissipation channel 21 is opposite to the airflow direction of the adjacent middle heat dissipation channel 22, and the airflow direction of the middle heat dissipation channel 22 is opposite to the airflow direction of the adjacent lower heat dissipation channel 23. The location and the number of the fans are not limited to the examples given in this embodiment, and the fans are not necessarily located on the same side of the chassis. Instead, depending on the requirement of heat dissipation, they may be arranged at one end or two ends of the heat dissipation channels.

In this embodiment, the heat dissipation system uses two air baffles to split the chassis into three heat dissipation channels: upper heat dissipation channel, middle heat dissipation channel, and lower heat dissipation channel, which further facilitates heat dissipation. This embodiment is applicable to heat dissipation of a large communication device with a box type chassis.

Those skilled in the art should understand that the number of air baffles in the communication device with a box type chassis depends on the size of the communication device with a box type chassis, and is not limited to the one or two air baffles.

When a circuit board is plugged into a slot, it is parallel to the air baffle; the fans of the device are under stepless speed adjustment, and the air speed is adjusted automatically according to the highest component temperature of the circuit board so that the board temperature is controlled within a certain range.

In the box type chassis provided in the embodiment of the present application, any type of heat dissipation system for a communication device with a box type chassis according to the foregoing embodiments is arranged. An upper heat dissipation channel and a lower heat dissipation channel are arranged in the box type chassis, and therefore, heat dissipated by a circuit board is circulated in the box type chassis through an airflow, the temperature in the box type chassis reaches an extent that prevents vapor from condensing, condensation is prevented, and the circuit board is protected against corrosion caused by condensation.

A communication device with a box type chassis according to an embodiment of the present application includes electronic components and a box type chassis, where any type of heat dissipation system for a communication device with a box type chassis according to the foregoing embodiments is arranged in the box type chassis, and the electronic components are located in an upper heat dissipation channel and a lower heat dissipation channel of the heat dissipation system in the box type chassis.

Through-holes exist on the box type chassis to provide ventilation from the left side to the right side or conversely, as shown in FIG. 3 to FIG. 7.

The size of the box type chassis may be 442 mm×220 mm×88 mm, and a total of 2×4 slots are used for holding circuit boards. 184 mm×195 mm) circuit boards plugged are parallel to the air baffles in the heat dissipation system.

The box type chassis further includes a fan board and a backplane, where the fan board is used to mount the fans in the heat dissipation system.

An air blowing manner accomplishes better heat dissipation. Therefore, high power consumption circuit boards are plugged in a heat dissipation channel that works in the air blowing manner, and low power consumption circuit boards are plugged in a heat dissipation channel that works in an air extraction manner. High power consumption circuit boards may be plugged in the upper heat dissipation channel 21 in FIG. 3.

In this embodiment, the communication device may be a box type network product that dissipates heat in an air cooling manner.

In the above embodiment, hot air circulation of the communication device itself is used to increase the temperature at the air intake vent of the box type chassis, which prevents corrosion, enhances reliability of the communication device with a box type chassis, avoids corrosion in the service life of the communication device with a box type chassis, and ensures normal communication. The heat dissipation system and the communication device with a box type chassis in the foregoing embodiments are applicable indoors and outdoors, and especially, in adverse environments, can better exert the anticorrosion performance of the communication device with a box type chassis.

In addition, the heat dissipation system and the communication device with a box type chassis have a simple structure, require no additional consumables, consume little energy, and are environment-friendly and good for reducing manufacturing costs. Further, they can reduce the relative humidity of air blown to the circuit board, improve reliability of the communication device, and reduce the failure probability of the communication device.

Research and tests show that in an environment with high salt pollution and high relative humidity, circuit boards of electronic devices such as communication devices are corroded quickly and lose the communication function. To improve reliability of the communication devices, the relative humidity needs to be reduced, and dust pollution of the circuit boards needs to be controlled to protect the circuit boards against the condensation impact. Condensation is a necessary condition for circuit board corrosion, and condensation is related to pollution of electronic components such as circuit boards. If the condition for condensation is blocked, the electronic device can be prevented from failure caused by environment corrosion.

Taking NaCl (sodium chloride, a very common contaminant) pollution as an example:

In an environment with high relative humidity (greater than 85% RH), condensation occurs on the surface of circuit boards even if the circuit boards comply with all electronic assembly and delivery standards. On a highly polluted circuit board (a cooling fan that runs in a long term brings many contaminants that are then deposited on the circuit board), even if the relative humidity of the environment is less than 65% RH, visible condensation still occurs.

When the relative humidity is greater than 75% RH, visible condensation occurs on the surface of circuit boards polluted to any extent. Research shows that the occurrence of the condensation phenomenon can be controlled as long as the pollution extent and the relative humidity on the surface of a circuit board are controlled strictly. The heat dissipation system described above reduces the ambient pollution and the relative humidity of the circuit board while cooling the circuit board, and prevents condensation effectively.

A heat dissipation method for a communication device with a box type chassis in an embodiment of the present application includes:

arranging an air baffle in the box type chassis of the communication device with the box type chassis, and adjusting a fan in the box type chassis to generate a circulative airflow in the box type chassis.

Optionally, through-holes are arranged on the air baffle to adjust the volume of the circulative airflow.

In this embodiment, based on an anticorrosion mechanism, a circulative airflow generated in the box type chassis, that is, hot air, is used to circulate inside and increase the temperature at the air intake vent, reduce the relative humidity in the chassis, prevent condensation on the circuit board, achieve the purpose of resisting corrosion, and ensure long-term reliability of the circuit board.

Finally, it should be noted that the foregoing embodiments are merely intended for describing the technical solutions of the present application other than limiting the present application. Although the present application is described in detail with reference to the foregoing embodiments, a person of ordinary skill in the art should understand that modifications may still be made to the technical solutions described in the foregoing embodiments or equivalent replacements may be made to some technical features thereof, without departing from the scope of the technical solutions of the embodiments of the present application.

What is claimed is:

1. A heat dissipation system for a communication device, wherein the heat dissipation system comprises a box type chassis and an air baffle;
   the air baffle arranged in the box type chassis and configured to split an interior of the box type chassis into an upper heat dissipation channel and a lower heat dissipation channel;
   the upper heat dissipation channel and the lower heat dissipation channel both have an air exhaust vent and an air intake vent, the air intake vent and the air exhaust vent of the upper heat dissipation channel are defined on sidewalls of the box type chassis, the air intake vent and the air exhaust vent of the lower heat dissipation channel are defined on sidewalls of the box type chassis; and
   the air intake vent of the upper heat dissipation channel is located above the air exhaust vent of the lower heat dissipation channel;
   the air exhaust vent of the upper heat dissipation channel is located above the air intake vent of the lower heat dissipation channel;
   wherein a first channel is arranged at a position on the upper heat dissipation channel and near the air exhaust vent of the upper heat dissipation channel, and is used to guide air of the upper heat dissipation channel into the lower heat dissipation channel;
   wherein the first channel is implemented by arranging at least one through-hole on the air baffle.

2. The heat dissipation system for a communication device according to claim 1, wherein a second channel is arranged at a position on the upper heat dissipation channel and near the air intake vent of the upper heat dissipation, and is used to guide air of the lower heat dissipation channel into the upper heat dissipation channel;

wherein the second channel is implemented by arranging at least one through-hole on the air baffle.

3. The heat dissipation system for a communication device according to claim 1, wherein a fan is arranged in the heat dissipation system, and the fan is located at the air intake vent of the upper heat dissipation channel and is used to guide outside air and hot air out of the air exhaust vent of the lower heat dissipation channel into the upper heat dissipation channel.

4. The heat dissipation system for a communication device according to claim 1, wherein a fan is arranged in the heat dissipation system, and the fan is located at the air exhaust vent of the upper heat dissipation channel and is used to guide the upper heat dissipation channel to the outside.

5. The heat dissipation system for a communication device according to claim 1, wherein a fan is arranged in the heat dissipation system, and the fan is located at the air intake vent of the lower heat dissipation channel and is used to guide outside air and hot air out of the air exhaust vent of the upper heat dissipation channel into the lower heat dissipation channel.

6. The heat dissipation system for a communication device according to claim 1, wherein a fan is arranged in the heat dissipation system, and the fan is located at the air exhaust vent of the lower heat dissipation channel and is used to guide hot air out of the air exhaust vent of the lower heat dissipation channel to the outside.

7. A communication device assembly, the communication device assembly comprising electronic components and a heat dissipation system;

the heat dissipation system comprises a box type chassis and an air baffle;

the air baffle, arranged in the box type chassis and configured to split an interior of the box type chassis into an upper heat dissipation channel and a lower heat dissipation channel;

the upper heat dissipation channel and the lower heat dissipation channel both have an air exhaust vent and an air intake vent, the air intake vent and the air exhaust vent of the upper heat dissipation channel are defined on sidewalls of the box type chassis, the air intake vent and the air exhaust vent of the lower heat dissipation channel are defined on sidewalls of the box type chassis; and wherein the air intake vent of the upper heat dissipation channel is located above the air exhaust vent of the lower heat dissipation channel of the heat dissipation system;

the air exhaust vent of the upper heat dissipation channel is located above the air intake vent of the lower heat dissipation channel;

wherein the electronic components are located in the upper heat dissipation channel and the lower heat dissipation channel; and wherein a first channel is arranged at a position on the upper heat dissipation channel and near the air exhaust vent of the upper heat dissipation channel, and is used to guide air of the upper heat dissipation channel into the lower heat dissipation channel;

wherein the first channel is implemented by arranging at least one through-hole on the air baffle.

8. The heat dissipation system for a communication device according to claim 1, wherein the upper heat dissipation channel and lower heat dissipation channel are adapted to contain and dissipate heat from electronic components.

* * * * *